United States Patent
Szmanda et al.

(10) Patent No.: US 6,787,286 B2
(45) Date of Patent: Sep. 7, 2004

(54) SOLVENTS AND PHOTORESIST COMPOSITIONS FOR SHORT WAVELENGTH IMAGING

(75) Inventors: Charles R. Szmanda, Westborough, MA (US); Anthony Zampini, Westborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 77 days.

(21) Appl. No.: 10/101,202

(22) Filed: Mar. 19, 2002

(65) Prior Publication Data

US 2003/0036016 A1 Feb. 20, 2003

Related U.S. Application Data

(60) Provisional application No. 60/278,170, filed on Mar. 22, 2001.

(51) Int. Cl.$^7$ .............................. G03F 7/039; G03F 7/26
(52) U.S. Cl. ................................. 430/270.1; 430/271.1; 430/311; 430/326; 430/912
(58) Field of Search ........... 430/311–331, 270.1–288.1, 430/154–197

(56) References Cited

U.S. PATENT DOCUMENTS

| | | | | | |
|---|---|---|---|---|---|
| 4,365,049 A | * | 12/1982 | Tsunoda et al. | ............ | 526/245 |
| 4,732,843 A | * | 3/1988 | Budde et al. | ............ | 430/275.1 |
| 4,803,147 A | * | 2/1989 | Mueller et al. | ........... | 430/288.1 |
| 4,810,618 A | * | 3/1989 | Koike et al. | ............. | 430/281.1 |
| 5,006,443 A | * | 4/1991 | Muller | ..................... | 430/270.1 |
| 5,021,320 A | * | 6/1991 | Mueller et al. | ............. | 430/192 |
| 5,122,436 A | * | 6/1992 | Tunney et al. | ........... | 430/288.1 |
| 5,985,507 A | * | 11/1999 | Blakeney et al. | ........... | 430/190 |
| 2001/0010890 A1 | * | 8/2001 | Hatakeyama et al. | .... | 430/270.1 |
| 2001/0038969 A1 | * | 11/2001 | Hatakeyama et al. | .... | 430/270.1 |
| 2002/0051938 A1 | * | 5/2002 | Trefonas et al. | ......... | 430/270.1 |
| 2002/0081520 A1 | * | 6/2002 | Sooriyakumaran et al. | ...... | 430/270.1 |

FOREIGN PATENT DOCUMENTS

| | | | | | |
|---|---|---|---|---|---|
| EP | 0040841-a1 | * | 12/1981 | ............. | G03F/7/10 |
| EP | 0 843 218 a1 | * | 5/1998 | ........... | G03F/7/023 |
| GB | 2023858 a | * | 1/1980 | ............ | G03C/1/52 |
| WO | WO 00/17712 | | 3/2000 | | |
| WO | WO 00/67072 | | 11/2000 | | |
| WO | WO-01/85811 A2 | * | 11/2001 | | |

OTHER PUBLICATIONS

RN 111–15–9, From online STN file Registry, copyright 2003 ACS on STN, one page.*
RN 110–49–6, From online STN file Registry, copyright 2003 ACS on STN, one page.*
RN 111–76–2, From online STN file Registry, copyright 2003 ACS on STN, one page.*
RN 110–80–5, From online STN file Registry, copyright 2003 ACS on STN, one page.*
RN 109–86–4, From online STN file Registry, copyright 2003 ACS on STN, one page.*
RN 110–43–0, From online STN file Registry, copyright 2003 ACS on STN, one page.*
Cannella, William, "Xylenes and Ethylbenzene", Kirk–Othmer Encyclopedia of Chemical Technology, 1998, John Wiley & Sons from online posting at www.mrw.interscience, wiley,com/kirk/articles/xylecann...including a01/ abstract, sect11–15 and 19 with 26 page.*
www.fluorchemical.com/products/surfact/surfact_b, 3M Fluorad, 5, no date given.*
M. Toriumi et al., "Resist Materials for 157nm Lithography", Proceedings of the SPIE—The International Society for Optical Engineering, vol. 4345, No. 1, Feb. 2001, pp. 371–378.
T. Ogata et al., "New Polymer for 157nm Single–Layer Resist Based on Fluorine Containing Acryl Copolymer", Proceedings of the SPIE—The International Society for Optical Engineering, vol. 4345, No. 2, Feb. 2001, pp. 10481048–1055.

* cited by examiner

*Primary Examiner*—Cynthia Hamilton
(74) *Attorney, Agent, or Firm*—Peter F. Corless; Darryl P. Frickey; Edwards & Angell, LLP

(57) ABSTRACT

New photoresists are provides that are suitable for short wavelength imaging, particularly sub-170 nm such as 157 nm. Resists of the invention comprise a fluorine-containing polymer, a photoactive component, and a solvent component. Preferred solvents for use on the resists of the invention can maintain the resist components in solution and include one or more preferably two or more (i.e. blends) of solvents. In particularly preferred solvent blends of the invention, each blend member evaporates at substantially equal rates, whereby the resist composition maintains a substantially constant concentration of each blend member.

23 Claims, No Drawings

SOLVENTS AND PHOTORESIST COMPOSITIONS FOR SHORT WAVELENGTH IMAGING

The present application claims the benefit of U.S. provisional application No. 60/278,170, filed Mar. 22, 2001, which is incorporated herein by reference in its entirety.

BACKGROUND OF THE INVENTION

1. Field of the Invention

The present invention relates to new photoresists that are suitable for short wavelength imaging, including sub-200 nm, particularly sub-170 nm such as 157 nm. Resists of the invention comprise a fluorine-containing polymer, a photoactive component, typically one or more photoacid generators, and a solvent component. Preferred solvents for use on the resists of the invention can maintain the resist components in solution and include a blend of two or more fluid materials (blend members). In particularly preferred solvent blends of the invention, each blend member evaporates at substantially equal rates, whereby the resist composition maintains a substantially constant concentration of each blend member.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 193 nm. Use of such short exposure wavelengths can enable formation of smaller features. Accordingly, a photoresist that yields well-resolved images upon 248 nm or 193 nm exposure could enable formation of extremely small (e.g. sub-0.25 μm) features that respond to constant industry demands for smaller dimension circuit patterns, e.g. to provide greater circuit density and enhanced device performance.

Quite recently, $F_2$ excimer laser imaging, i.e. radiation having a wavelength of about 157 nm, has been considered as a route to manufacture of even smaller features. See, generally, Kunz et al., SPIE Proceedings (Advances in Resist Technology), vol. 3678, pages 13–23 (1999).

SUMMARY OF THE INVENTION

Novel photoresist compositions are provided that comprise a fluorine-containing polymer, a photoactive component particularly a photoacid generator compound, and solvent. Resists of the invention are particularly suitable for imaging at extremely short wavelengths, such as sub-170 nm, particularly about 157 nm.

In one aspect, preferred solvents for use in resists of the invention include heptanone, particularly 2-hetaptanone (methyl-n-amyl-ketone) and 3-heptanone; ethyl-n-amyl-ketone; ethylene glycol ethyl ether; propylene glycol methyl ether acetate; amyl acetate; methyl iso-amyl ketone; methyl ethyl ketone; ethylene glycol methyl ether acetate; methy-lamyl acetate; ethylene glycol methyl ether acetate; ethyl-n-butyl ketone; iso-butyl isobutyrate; 2-methyl-1-pentanol (hexanol); ethylene glycol propyl ether; propylene glycol t-butyl ether; methylcaproate; ethyl caproate (ethyl hexanoate); cumene (isopropylbenzene); xylenes; anisole; cyclohexanone; ethylene glycol ethyl ether acetate; 1-tridecanol; cyclohexanol; mesitylene; hexyl acetate (2-methyl-1-pentyl acetate); diethylene glycol dimethyl ether (diglyme); diisobutyl ketone; di-n-propyl carbonate; diacetonealcohol; ethylene glycol butyl ether; and propylene glycol butyl ether.

In another aspect, preferred solvents for use in resists of the invention are halogenated materials, particularly fluorinated materials. Such halogenated solvents can be particularly effective in solubilizing a fluorinated resin of a resist of the invention. Exemplary halogenated solvents for use in resists of the invention include halogenated aromatic solvents such as chlorobenzene, fluorobenzene, trifluoromethylbenzeone, bis-(trifluoromethyl)benzene, and the like; perfluoroalkyl solvents; and fluoroethers such as HFE-700, FC-43, and FC-3248 (all available from the 3M Corporation) and other fluoroether solvents and other fluorinated solvents available from 3M Corporation; and the like.

Resists formulations are also preferred that comprise a blend of solvents, wherein one of the blend members is a heptanone, preferably 2-heptanone. Other blend members may suitably be e.g. ethyl lactate, propylene glycol methyl ether acetate (PGMEA), diacetone alcohol, hexyl acetate, ethyl hexanoate, gamma-butyrolactone (GBL), diglyme, propylene glycol dimethyl ether, and propylene glycol methyl ether.

Other solvent blends for use with resists of the invention include blends that comprise other ketones or other carbonyl functionalities (e.g., ester). It has been found that solvents that contain a carbonyl group can solvate a fluoropolymer more effectively than other non-carbonyl solvents. In particular, cyclohexanone, various dialkyl-ketone such as diisobutyl ketone and ethoxy ethyl propionate are preferred solvents for are use in a resist formulation of the invention, including as a blend member with one or more other solvents such as ethyl lactate, propylene glycol methyl ether acetate (PGMEA), diacetone alcohol, hexyl acetate, ethyl hexanoate, gamma-butyrolactone (GBL), diglyme, propylene glycol dimethyl ether, and propylene glycol methyl ether. In general, a ketone solvent such as a heptanone or dissobutyl ketone, is more preferred than an ester-containing solvent such as ethyl ethoxy propionate.

Solvent blends of resist formulations of the invention may suitably comprise two or three or more different solvents in a single blend, more typically two or three distinct solvents. Preferably a carbonyl solvent, such as a heptanone, diisobutyl ketone, is present in a solvating effective amount, i.e. an amount wherein the carbonyl solvent itself is effective in dissolving the resist components.

A preferred component of a resist solvent blend of the invention is a halogenated solvent such as those discussed above. Enhanced solubilization can be realized in many cases with the halogenated solvent present as even a minor component of the solvent blend, e.g. where one or more halogenated solvents comprise about 50 volume percent or less of the total solvent of a resist composition, or where one or more halogenated solvents comprise about 40, 30, 25, 20, 15, 10, 5, 3 or even 2 volume percent or less of the total solvent of a resist composition. A solvent blend of a resist composition of the invention also may contain greater amounts of one or more halogenated solvents, e.g. where one or more halogenated solvents comprise about 55, 60, 70, 80, 90 or 95 volume percent or more of the total solvent of a resist composition. One or more halogenated solvents are preferably used in a solvent blend that comprises other solvents that contain carbonyl and/or hydroxy moieties, e.g. a heptanone, cyclohexanone, ethyl lactate, and the like.

Another preferred component of a resist solvent blend of the invention is water. It is believed water may stabilize a solvent blend and a resist composition, e.g. render a photoacid generator compound more resistant to degradation during storage. Water present as residual solvent after a soft-bake step also may facilitate a deprotection reaction of photoacid-labile groups present in a resist composition. Preferably, water will be present in relatively small amounts in a resist composition, e.g. where water constitutes no more than about 10, 8, 6, 5, 4, 3, 2, 1, 0.5 or 0.25 volume percent of the total solvent of a resist composition. Generally preferred is where water is present in no more than about 3, 2, 1, 0.5 or 0.25 volume percent of the total solvent component of a resist composition. Water preferably will be employed in a solvent blend that comprises other solvents that contain carbonyl and/or hydroxy moieties, e.g. a heptanone, cyclohexanone, ethyl lactate, and the like.

Particularly preferred solvent blends of the invention will vaporize from a resist formulation at substantially constant rates, whereby blend members remain at substantially equal concentrations in the resist composition. In particular, preferred are solvent blends which can form azeotropes at about room temperature, thereby evaporating from a resist liquid formulation at a constant rate, maintaining a substantially constant ratio of solvent blend members in the resist composition. By maintaining a substantially constant ratio of blend members throughout coating and soft-bake treatment, lithographic properties of the resist can be improved as may be related to enhanced film-forming characteristics of the resist, e.g. avoidance of undesired crystallization or other precipitation of resist components, irregular film layer formation, undesired segregation of polymer chains, and the like.

In addition to a fluorine-polymer and photoactive component, resists of the invention may suitably comprise one or more other components, such as a basic additive, a dissolution inhibitor compound which preferably is a polymeric and/or fluorinated composition, surfactant or leveling agent; and a plasticizer. Preferred resists of the invention also may comprise a blend of two or more resin components, preferably where each blend member is a fluorine-containing resin, and/or a blend of two or more photoacid generator compounds.

The invention also includes methods for forming relief images, including methods for forming a highly resolved relief image such as a pattern of lines (dense or isolated) where each line has vertical or essentially vertical sidewalls and a line width of about 0.40 microns or less, or even about 0.25, 0.20, 0.15, or 0.10 microns or less. In such methods, preferably a coating layer of a resist of the invention is imaged with short-wavelength radiation, particularly sub-200 nm radiation, especially 157 nm radiation, and higher energy radiation having a wavelength of less than 100 nm, and otherwise high energy radiation such as EUV, electron beam, ion beam or x-ray. The invention further comprises articles of manufacture comprising substrates such as a microelectronic wafer having coated thereon the photoresists and relief images of the invention. Other aspects of the invention are disclosed infra.

DETAILED DESCRIPTION OF THE INVENTION

As discussed above, novel photoresist compositions are provided that comprise a fluorine-containing polymer, a photoactive component particularly a photoacid generator compound, and solvent.

The solvent component may suitably contain a single solvent, or contain multiple distinct fluids (solvent blend).

As discussed above, particularly preferred solvents for use in resists of the invention are fluids that contain ketone or other carbonyl (e.g. ester) functionality, such as a heptanone, e.g. 2-hetaptanone (methyl-n-amyl-ketone) and 3-heptanone, with 2-heptanone being generally preferred; methyl iso-amyl ketone; a variety of dialkyl ketones, such as $C_{1-12}$alkyl(C=O)$C_{1-12}$alkyl, more preferably $C_{2-6}$alkylC(=O)$C_{2-6}$alkyl such as ethyl-n-butyl ketone and diisobutylketone; and alicyclic ketone compounds such as cylohexanone.

As used herein, the term "ketone" is used in accordance with its recognized meaning, i.e. a functionality of the structure —(C=O)—, typically with adjacent saturated carbons, and not inclusive of groups with hetero atoms adjacent to the —C(=O)— structure such as esters, amides, carboxy and the like. The term "carbonyl" as used herein includes the moiety —C(=O)— with adjacent carbons as well as hetero atoms, i.e. the term "carbonyl" is inclusive of ketones, esters, amides, carboxy (—COOH), and the like.

Resists formulations are preferred that comprise a blend of solvents, wherein one of the blend members is a heptanone, preferably 2-heptanone. Other blend members may suitably be e.g. ethyl lactate, propylene glycol methyl ether acetate (PGMEA), diacetone alcohol, hexyl acetate, ethyl hexanoate, gamma-butyrolactone (GBL), diglyme, propylene glycol dimethyl ether, and propylene glycol methyl ether.

Other solvent blends for use with resists of the invention include blends that comprise other ketones or carbonyl functionalities (e.g., ester). It has been found that solvents that contain a carbonyl group can solvate a fluoropolymer more effectively than other non-keto solvents. In particular, cyclohexanone, barious dialkyl-ketone such as diisobutyl ketone and ethoxy ethyl propionate are preferred solvents for are use in a resist formulation of the invention, including as a blend member with one or more other solvents such as ethyl lactate, propylene glycol methyl ether acetate (PGMEA), diacetone alcohol, hexyl acetate, ethyl hexanoate, gamma-butyrolactone (GBL), diglyme, propylene glycol dimethyl ether, and propylene glycol methyl ether.

Solvent blends of resist formulations of the invention may suitably comprise two, three, four or more different solvents in a single blend, more typically two or three distinct solvents in a single resist composition. Preferably a carbonyl solvent, such as a heptanone, dissobutyl ketone, is present in a solvating effective amount, i.e. an amount wherein the carbonyl solvent itself is effective in dissolving the resist components. A solvating effective of a carbonyl solvent typically is where the carbonyl solvent constitutes at least about 20, 30, 40, 50, 60, or 70 volume percent of a solvent blend, for a resist composition formulated at 85 to 90 weight percent solvent based on total weight of the composition.

As discussed above, halogenated solvents, particularly fluorinated solvents such as organic fluoroether solvents e.g. having 1 to about 8 or 10 carbons are preferred solvent blend members. Additionally, as discussed above, water is a preferred solvent blend member, preferably present in relatively small amounts of the total solvent component of a resist composition, e.g. less than about 10, 9, 8, 7, 6, 5, 4, 3, 2, or 0.5 volume percent of all solvent of a resist composition.

As discussed above, particularly preferred solvent blends of the invention will vaporize from a resist formulation at substantially constant rates, whereby blend members remain at substantially equal concentrations in the resist compositions. In particular, preferred are solvent blends which can form azeotropes at about room temperature (ca. 25° C.), thereby evaporating from a resist liquid formulation at a constant rate, maintaining a substantially constant ratio of solvent blend members in the resist composition.

A room temperature solvent azeotrope for use in a resist composition of the invention can be readily identified by simple testing. For instance, a solvent of two members can be admixed at different portions, e.g. a first blend sample having 5 parts by volume of the first blend member to 20 parts of the second blend member; a second blend member having 5 parts by volume of the first blend member to 15 parts of the second blend member; a third blend sample having 5 parts of the first blend member to 10 parts of the second blend member; a fourth blend sample having 5 parts of the first blend member to 5 parts of the second blend member; a fifth blend sample having 10 parts of the first blend member to 5 parts of the second blend partner; a sixth blend sample having 15 parts of the first blend member to 5 parts of the second blend partner; and a seventh blend sample having 20 parts of the first blend member to 5 parts of the second blend partner.

Each of those blend samples is contained in an open top vessel and subjected to increasingly reduced pressure until the blend boils at room temperature. Immediately upon reaching boiling a sample is condensed and isolated. Additional samples are condensed and collected during the course of the low pressure boiling of the blend, e.g. after 50 volume percent of the blend sample has been vaporized, another sample of the blend is condensed and isolated.

A solvent blend will be considered a room temperature azeotrope where the composition of the condensed and isolated sample approximates the composition of the solvent blend, e.g. where the solvent blend members of the isolated sample are present in volume amounts within about 30, 20, 10 or even 5 percent of the composition of the thermally treated solvent blend. For preferred azeotropes, a condensed sample isolated after approximately 50 volume of the original blend sample has been vaporized approximates the composition of the solvent blend, e.g. where the solvent blend members of the isolated sample are present in volume amounts within about 30, 20, 10 or even 5 percent of the composition of the thermally treated solvent blend. Amounts of each blend member of an isolated sample may be suitably determined by any of a number of methods such as gas chromatography.

Specifically preferred solvent blends of resist compositions of the invention include:

1) a solvent blend comprising a heptanone preferably 2-heptanone and ethyl lactate, where the heptanone and ethyl lactate together preferably constitute at least 60, 70, 80, 90 or 95 volume percent of all solvent of a resist composition, and preferably where the heptanone is in a greater volume amount than the ethyl lactate, preferably where the heptanone:ethyl lactate volume-to-volume ratio is 2:1 or greater;

2) a solvent blend comprising a heptanone preferably 2-heptanone and propylene glycol methyl ether acetate, where the heptanone and propylene glycol methyl ether acetate together preferably constitute at least 60, 70, 80, 90 or 95 volume percent of all solvent of a resist composition, and preferably where the heptanone is in a greater volume amount than the propylene glycol methyl ether acetate, preferably where the heptanone: propylene glycol methyl ether acetate volume-to-volume ratio is 2:1 or greater;

3) a solvent blend comprising cyclohexanone and ethyl lactate, where the cyclohexanone and ethyl lactate together preferably constitute at least 60, 70, 80, 90 or 95 volume percent of all solvent of a resist composition, and preferably where the cyclohexanone is in a greater volume amount than the ethyl lactate, preferably where the cyclohexanone: ethyl lactate volume-to-volume ratio is 2:1 or greater;

4) a solvent blend comprising a cyclohexanone and propylene glycol methyl ether acetate, where the cyclohexanone and propylene glycol methyl ether acetate together preferably constitute at least 60, 70, 80, 90 or 95 volume percent of all solvent of a resist composition, and preferably where the cyclohexanone is in a greater volume amount than the propylene glycol methyl ether acetate, preferably where the cyclohexanone:propylene glycol methyl ether acetate volume-to-volume ratio is 2:1 or greater;

5) a solvent blend that comprises both 2-heptanone and 3-heptanone, where the 2-heptanone and 3-heptanone preferably constitute at least about 40, 50, 60, 70, 80, 90 or 95 volume percent of all solvent of a resist composition;

6) a solvent blend that comprises a heptanone, preferably 2-heptanone, cyclohexanone, and at least one additional solvent, e.g. a ketone, carbonyl or non-carbonyl solvent such as ethyl lactate or propylene glycol methyl ether acetate;

7) a solvent blend that comprises water, and one or more additional solvents such as one or more of a carbonyl and/or non-carbonyl solvent such as a heptanone, cyclohexanone, ethyl lactate, propylene glycol methyl ether acetate, and the like; preferably, water is present in minor amounts, e.g. no more than about 5 volume %, more preferably no more than about 4, 3, 2, 1, 0.5 or 0.25 volume percent of the total solvent component of a resist composition; and 8) a solvent blend that comprises a halogenated solvent, particularly a fluorinated solvent such as an HFE solvent (hydrofluoroether available from 3M), and one or more additional solvents such as one or more of a carbonyl and/or non-carbonyl solvent such as a heptanone, cyclohexanone, ethyl lactate, propylene glycol methyl ether acetate, and the like.

Less preferred, and hence excluded from preferred aspects of the invention, as solvent blends, particularly binary solvent blends (i.e. a resist having a total of two distinct solvents) that contain a ketone such as methyl ethyl ketone and a benzene solvent such as a halobenzene particularly chloro benzene. Also excluded from certain preferred aspects of the invention are photoresists that contain PGMEA (propylene glycol methyl ether acetate), particularly PGMEA as a sole solvent (no blend partners).

Solvents used in resist compositions of the invention preferably are employed at a high purity, e.g. greater than 98 percent or 99 percent purity as may be determined by gas chromatography. Solvents used in resists of the invention also may be suitably filtered immediately prior to use.

As discussed above, resists of the invention suitably comprise a fluorine-containing resin, a photoactive component which preferably comprises one or more photoacid generator compounds, and optionally one or more other additives such as a base additive, one or more dissolution inhibitor compounds, a surfactant, and/or a plasticizer.

Resins

The fluorine-containing resin component of a resist of the invention suitably contains a repeat unit derived from at least one ethylenically unsaturated compound. Preferably the unsaturated group is an alicyclic group such as norbornene, cyclohexene, adamantene and the like. The alicylic unsaturated compound preferably has one or more substituents of fluorine, perfluoroalkyl particularly $C_{1-12}$perfluoralkyl, or perfluoroalkoxy particularly $C_{1-12}$perfluoralkoxy. Preferably, such a fluorine substituent is separated from the unsaturated carbons by at least one saturated carbon in order to not unduly inhibit the polymerization reaction. Also preferred are fluorinated olefinic compounds such as tetrafluorethylene (TFE) compounds and hexafluoroisopropanol compounds and derivatives thereof. Exemplary preferred unsaturated compounds for synthesis of fluorine-containing polymers of the invention include the following of Formulae (A) through (J):

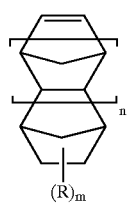
(A)

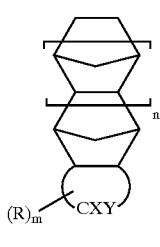
(B)

CH$_2$=CHCO$_2$R (C)

CH$_2$=CHOR (D)

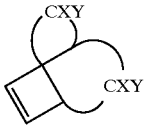
(E)

(F)

TFE (G)

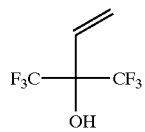
(H)

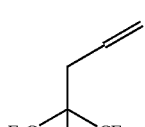
(I)

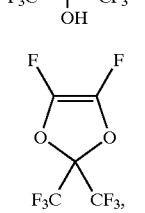
(J)

wherein in those Formulae (A) through (J), each R is independently hydrogen or a non-hydrogen substituent such as a halogen particularly fluoro optionally substituted alkyl such as $C_{1-12}$ alkyl, haloalkyl particularly $C_{1-12}$fluoroalkyl preferably $C_{1-12}$perfluoroalkyl., optionally substituted alkoxy such as $C_{1-12}$ alkoxy, haloalkoxy particularly $C_{1-12}$fluoroalkyl, a carboxyl group, $C_{1-14}$alkylcarboxyl, or a photoacid-labile group such as an photoacid-labile ester or acetal;

m is an integer of 1 to the maximum permitted by the valence of the monomer, and m is typically 1, 2, 3, 4 or 5; and n is 0, 1 or 2. Some of the compounds (A) through (J) are generally described in WO 00/17712, incorporated herein by reference.

Generally preferred monomers of the above formulae, include those of the following Formulae (K) and (L):

(K)

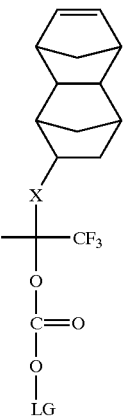

-continued

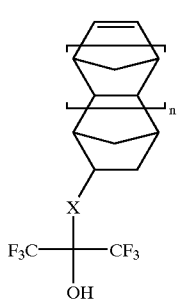
(L)

wherein in those Formulae (K) and (L), X is (—CH$_2$—)$_p$ where p is zero, 1 or 2, preferably 1 or 2, or —OCH$_2$— or —CH$_2$O—;
—OCH$_2$—; —CH$_2$OCH$_2$—; or —CH$_2$O—; LG is hydrogen or a component of a photoacid-labile moiety, such as a quaternary carbon e.g. t-butyl or other quaternary carbon of an optionally substituted C$_{4-18}$alkyl; and n is zero or 1.

Generally preferred pendant groups from a monomer (such as groups R in (A) through (F)) incorporated into a resin of a resist of the invention include groups of the following structure:

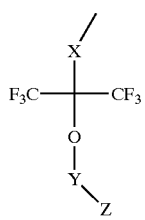

wherein X is as defined for Formulae (K) and (L) above;
Y is hydrogen, a chemical bond linking the oxygen and group Z, (—CH$_2$—)$_p$ where p is 1 or 2, —CH$_2$O—, or CHRO— where R is C$_{1-16}$alkyl, preferably C$_{1-4}$alkyl; and
Z is alkyl preferably having 1 to about 20 carbon s and including tri(C$_{1-16}$)alkylmethyl; di(C$_{1-16}$)alkylcarboxylicarylmethyl; benzyl; fenchyl; tri(C$_{1-16}$ alkyl)carbocyclicaryl; C$_{1-16}$alkylcarbonyloxy; a formyl group; an acetate group such as having 2 to about 20 carbon atoms; tetrahydropyranyl; or tetrahydrofuranyl; and preferably X is —OCH$_2$—; preferably Y is a bond or —CH$_2$O—; and preferably Z is t-butyl, methyl or fenchyl.

Additional monomers that may be polymerized to provide a fluorine-containing resin of a resist of the invention include those of the following Formulae (M) through O), where starting materials (i.e. (N') and (O')) are shown as well as the polymerized group (i.e. (M"), (N") and (O")):

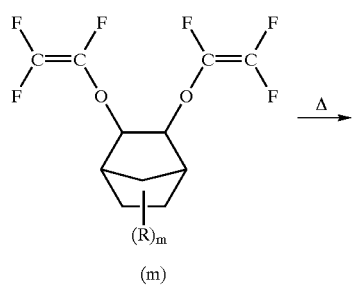
(m)

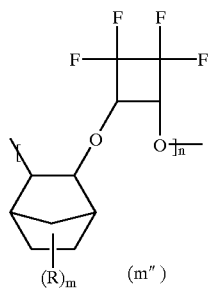
(m")

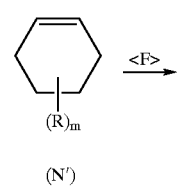
(N')

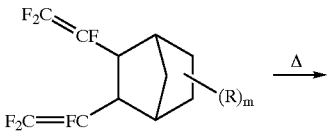
(N)

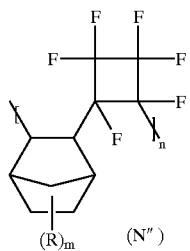
(N")

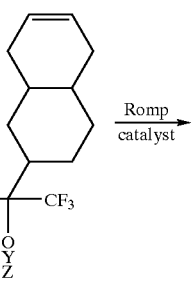
(O')

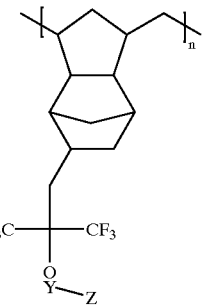
(O)

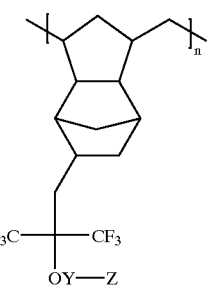
(O")

in those structures for M, M", N, N', N", O, O' and O", R and m are the same as defined above for monomers of Formulae (A) through (J); X is (—CH$_2$—)$_p$ where p is zero or 1; —OCH$_2$—; —CH$_2$OCH$_2$—; or —CH$_2$O—;.

Y is a bond, hydrogen, —CH$_2$O—, or —CHRO— where R is C$_{1-16}$alkyl, preferably C$_{1-4}$alkyl;; and preferably X is —OCH$_2$—; and preferably Y is a bond or —CH$_2$O—.

Specifically preferred units of a fluorine polymer of a resist of the invention include the units of the following Formulae 1 through 9:

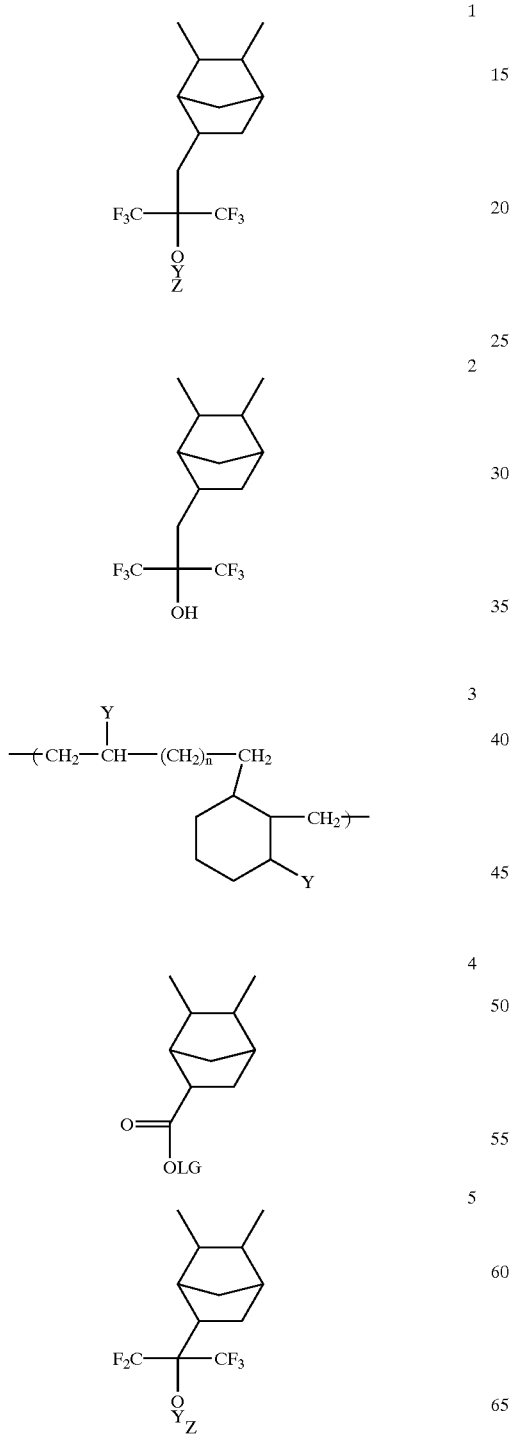

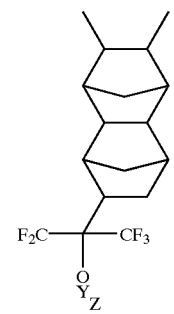

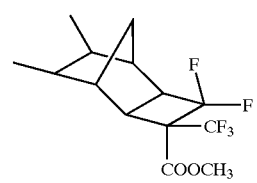

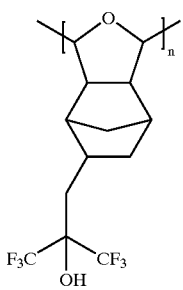

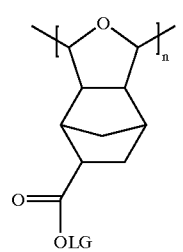

wherein in those structures 1 through 9, LG is hydrogen, C$_{1-12}$alkyl or a component of a photoacid-labile moiety, such as a quaternary carbon (e.g. t-butyl); and Y and Z are the same as defined above, i.e. Y is hydrogen, a chemical bond linking the oxygen and group Z, (—CH$_2$—)p where p is 1 or 2, —CH$_2$O—, or CHRO— where R is C$_{1-16}$alkyl, preferably C$_{1-4}$alkyl; and Z is alkyl preferably having 1 to about 20 carbon s and including tri(C$_{1-16}$)alkylmethyl; di(C$_{1-16}$) alkylcarboxylicarylmethyl; benzyl; fenchyl; tri(C$_{1-16}$ alkyl)carbocyclicaryl; C$_{1-16}$alkylcarbonyloxy; a formyl group; an acetate group such as having 2 to about 20 carbon atoms; tertrahydropyranyl; or tetrahydrofuranyl;

and preferably X is —OCH$_2$—; preferably Y is a bond or —CH$_2$O—; and preferably Z is t-butyl, methyl or fenchyl. In the above structures, the lines extended from the norbornyl ring indicate the polymer backbone or linkage thereto.

Particularly preferred fluorine-containing polymers for use in resists of the invention include resins that comprise repeat units selected from the following group of monomers of Formulae (P), (O), (R) and (S):

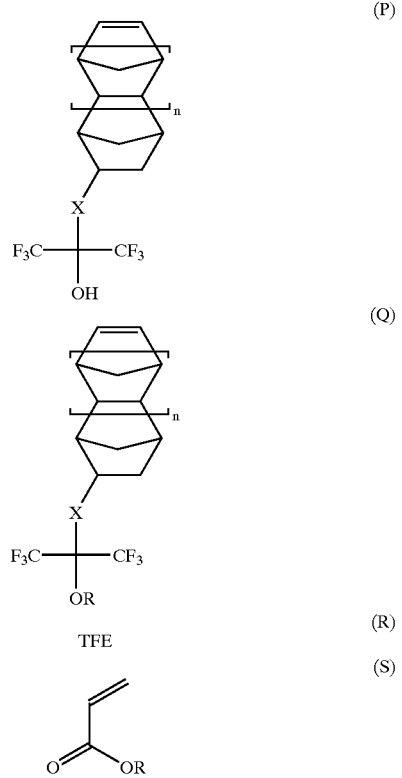

wherein in those Formulae (P), (O), (R) and (S), R is hydrogen or optionally substituted alkyl, such as $C_{1-12}$alkyl, particularly methyl, ethyl, propyl, butyl including t-butyl, and the like; and X is as defined above X is $(-CH_2-)_p$ where p is zero, 1 or 2, preferably 1 or 2, or $-OCH_2-$ or $-CH_2O-$.

Preferred polymers for use in resists of the invention include those that contain units of 1) (P) and (O) in combination; 2) (P), (Q') and (R) in combination; and 3) (P) and/or (Q'), R) and (S) in combination.

Particularly preferred polymers for use in resists of the invention include:

(1) resins consisting of units of (P) and (O) where (P):(Q') are present in a respective molar ratio of approximately: 50:50; 60:40; 70:30; 80:20; 90:10; 40:60; 30:70; 20:80; or 10:90;

(2) resins consisting of units of (P), (O) and (R), where (P) is present at about 10 to 60 mole percent based on total units of the polymer, preferably 20 to 50 or 30 to 40 mole percent based on total units of the polymer; (O) is present at about 1 to 50 mole percent based on total units of the polymer, preferably 5 to 50 or 10 to 40 mole percent based on total units of the polymer; and (R) is present at about 20 to 60 mole percent based on total units of the polymer, preferably 20 to 60 or 30 to 50 or 60 mole percent based on total units of the polymer; and (3) resins consisting of units of (P) and/or (O), (R) and (S), where (P) and (O) are each independently present at about 0 to 60 mole percent based on total units of the polymer, preferably 10 to 50 or 20 to 40 mole percent based on total units of the polymer, provided that at least one of (P) and (O) are present in the polymer; (R) is present at about 50 to 60 mole percent based on total units of the polymer, preferably 10 to 60 or 10 to 30, 40 or 50 mole percent based on total units of the polymer; and (S) is present at about 10 to 60 mole percent based on total units of the polymer, preferably 10 or 20 to 50 or 60 mole percent based on total units of the polymer.

The fluorine-containing polymer of a resist of the invention suitably does not contain aromatic units such as phenyl, naphthyl, or pyridyl.

As discussed above, a fluorine-containing polymer may be present with one or more other resins in a resist composition. Those additional resin(s) may or may not contain fluorine and typically do not contain aromatic units.

The resin component of a resist composition of the invention should be present in an amount sufficient to providing acceptable film-forming characteristics. See the example which follows for preferred amounts of a resin component.

Photoactive Component

A variety of photoactive components may be employed in resists of the invention. Photoacid generators (PAGs) are generally preferred. Particularly preferred PAGs for use in resists of the invention include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones and disulfonehydrazines, nitrobenzyl compounds, halogenated particularly fluorinated non-ionic PAGS. Preferred PAGs do not have aromatic substitution.

More specifically, preferred iodonium PAGs include those of the following Formula I:

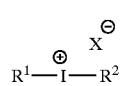

wherein in Formula I, $R^1$ and $R^2$ are each independently optionally substituted alkyl such as $C_{1-20}$alkyl including alicyclics such as cyclohexyl, adamantly, isobornyl, norbornyl, fencyl, dodecanyl, and the like; optionally substituted carbocyclic aryl such as phenyl, naphthyl and the like; and optionally substituted heteroaromatic or heteroalicyclic such as groups having 1 to 3 separate or fused rings and 1–3 hetero atoms (N, O or S) as ring members; and X is a counter anion such as a carboxylate or sulfonate counter anion, preferably a a sulfonate ($-SO_3^-$) or carboxylate($-COO^-$) substituted with one or more moieties such as optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocylic aryl such as phenyl or naphthyl; optionally substituted heteroaromatic or heteroalicyclic such as groups having 1 to 3 separate or fused rings and 1–3 hetero atoms (N, O or S) as ring members.

Preferred imidosulfonate PAGs include compounds of the following Formula II:

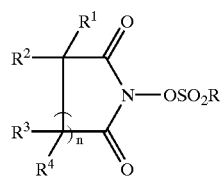

wherein in Formula II, R is suitably by optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocyclic aryl such as phenyl or naphthyl; optionally substituted heteroaromatic or heteroalicyclic such as groups having 1 to 3 separate or fused rings and 1–3 hetero atoms (N, O or S) as ring members;

$R^1$, $R^2$, $R^3$ and $R^4$ each independently being hydrogen or a group as defined for R, or where $R^2$ and $R^3$ are taken together and/or $R^1$ and $R^4$ are taken together to form a ring, preferably an alicyclic ring, e.g. having from 4 to about 8 ring members; and n is 1, 2, 3 or 4, preferably 1 or 2.

Preferred PAGs of Formula II include those with a fused alicyclic ring structure, such as PAGs of the following Formula IIa:

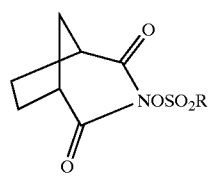

wherein in Formula IIa, R, $R^1$, $R^2$, $R^3$ and $R^4$ are each the same as defined in Formula II above, with one (and preferably all) of $R^1$, $R^2$, $R^3$ and $R^4$ suitably being hydrogen is the same as defined in Formula II above; and X is methylene (—$CH_2$—), O or S. Particularly preferred PAGs of Formula IIa include those where X is methylene and R is fluorinated $C_{1-12}$alkyl, particularly perfluoro$C_{1-12}$alkyl such as —$CF_3$.

Sulfonium PAGS also will be suitable for use in resists of the invention, although perhaps less preferred than the iodonium salts and imidosulfonate compounds. For instance, preferred sulfonium PAGs include compounds of the following Formula III:

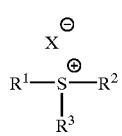

wherein $R^1$, $R^2$ and $R^3$ are each independently selected from the same group as defined for $R^1$ and $R^2$ in Formula I above; and X is the same as defined for Formula I above.

Also preferred are ring sulfonium PAGs such as those of the following Formula IV:

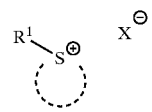

wherein $R^1$ and X are the same as defined in Formula III above; the dotted lines designate a ring structure that includes the depicted sulfur cation as a ring member, the ring suitably having 5 to about 8 ring members, and one, two or more endocyclic multiple bonds, and one or more optional ring substituents. Preferably the dotted lines form a non-aromatic ring, such as thienyl, or a completely saturated ring (no endocyclic double bonds).

In the above Formulae I, III and IV, preferred counter anions X are perfluoroalkyl and perfluoroalkoxy groups such as $C_{1-15}$perfluoroalkyl and $C_{1-15}$perfluoroalkoxy, e.g. triflate, perfluorobutanesulfonate, perfluorohexanesulfonate, perfluoroctanesulfonate, and perfluoroethoxyethylsulfonate.

A variety of other PAGs may be used in resists of the invention, including non-ionic PAGs such as substituted disulfone compounds; sulfonate compounds including N-oxyimino sulfonate compounds, α-cyano N-oxyimino sulfonate compounds; sidulfone hydrazine compounds; diazomethanedisulfone compounds; nitrobenzyl compounds; substituted acylsulfonoium compounds; and oxime sulfonate compounds including bis-N-oxyimidosulfonate compounds.

More particularly, preferred disulfone PAGs for use in resists of the invention include compounds of the following Formula V:

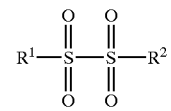

wherein $R^1$ and $R^2$ are the same as defined for Formula I above.

Preferred oxime sulfonate PAGs for use in resists of the invention include those of the following Formula VI:

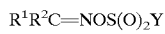

wherein $R^1$ and $R^2$ may be the same as defined above for Formula I, and/or where at least one of $R^1$ and $R^2$ is an electron-withdrawing moiety such as cyano, nitro, haloalkyl particularly $C_{1-12}$haloalkyl especially $C_{1-12}$perfluoroalkyl such as —$CF_3$, —$CF_2CF_3$ and other perfluoroalkyl, alkanoyl, and the like;

Y is a non-hydrogen substituent and is suitably the same as defined for R in Formula II above.

Preferred diazosulfone PAGS for use in resists of the invention include those of the following Formula VII:

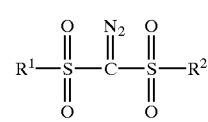

wherein $R^1$ and $R^2$ are the same as defined in Formula I above.

Preferred α,α-methylenedisulfone PAGs for use in resists of the invention include those of the following Formula VIII:

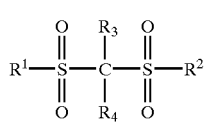

wherein $R^1$ and $R^2$ are the same or different and are other than hydrogen and are suitably the same as defined above in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

As mentioned above, disulfonehydrazine PAGS (i.e. hydrazine moiety interposed between the two sulfone moieties) also are suitable, preferably where the hydrazine moiety (e.g. —N($R^3$)—N($R^4$)— of Formula IX below) interposed between the two sulfone moieties is mono- or di-substituted with non-hydrogen substituents. Preferred disulfonehydrazine PAGS for use in resits of the invention include compounds of the following Formula IX:

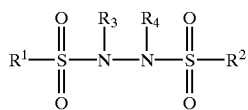

wherein $R^1$ and $R^2$ are the same or different and are other than hydrogen, and suitably are the same as defined in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

Further suitable PAGs for use in resists of the invention include disulfonylamine (i.e. —$SO_2$—N—$SO_2$—) salts, such as compounds of the following Formula X:

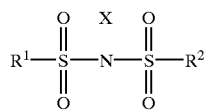

wherein $R^1$ and $R^2$ are the same or different and are other than hydrogen, and suitably are the same as defined in Formula I; and X is a counter ion.

One or more PAGS should be employed in a resist in an amount sufficient to provide a developable image upon exposure to activating radiation, such as 157 nm radiation. Suitably one or more PAGs are employed in an amount of 1 to 15 weight percent based on total solids of the resist (all components except solvent), more typically about 2 to 12 weight percent of total solids.

PAGs for use in resists of the invention can be made by generally known procedures. For instance, see U.S. Pat. Nos. 4,442,197 and 4,642,912 and European Application 0708368A1 for synthesis of iodonium PAGs. See WO 94/10608 for synthesis of N-sulfonyloxyimide PAGs. Diazosulfone PAGs can be made, e.g., by procedures disclosed in European Patent Application 0708368A1 and U.S. Pat. No. 5,558,976. See also WO 00/10056.

Basic Additive

As discussed above, resists of the invention may suitably comprise a basic additive. The basic additive can be used in relatively small amount (e.g. 0.1 to 1, 2 or about 3 weight percent of the photoactive component) and can significantly enhance lithographic performance, particularly resolution of a developed resist relief image. In particular, addition of an appropriate basic compound to a resist of the invention can effectively suppress undesired photoacid diffusion into masked areas following an exposure step.

Preferred basic additives are amine compounds, including primary, secondary, tertiary and quaternary amines. Amines that are not highly nucleophilic are generally preferred to avoid undesired reaction of the base additive with other resist composition components such as the PAG and/or solvent.

More particularly, secondary and tertiary amines are generally preferred, particularly secondary and tertiary amines that have sterically large substituents, such as optionally substituted alkyl having at least 3 or 4 carbons e.g. optionally substituted $C_{3-20}$alkyl; optionally substituted alkyl having at least 3 or 4 carbons e.g. optionally substituted $C_{3-20}$alkyl including alicyclic groups such as optionally substituted cyclohexyl, adamantly, isobornyl, etc.; optionally substituted alkenyl having at least 3 or 4 carbons e.g. optionally substituted $C_{3-20}$alkenyl; optionally substituted alkynyl having at least 3 or 4 carbons e.g. $C_{3-20}$alkynyl; optionally substituted carbocyclic ayl such as phenyl; optionally substituted heteroaryl or heroalicyclic such as heteroaryl or heteroalicyclic groups having 1 to 3 separate or fused rings with 1 to 3 hetero atoms (particularly N, O or S) per ring.

Specifically preferred basic additives for use in resist compositions of the invention include DBU (1,8-diazobicyclo[5.4.0]undec-7-ene); DBN (1,5-diazabicyclo[4.3.0]non-5-ene; N,N-bis-(2-hydroxyethyl)piperazine; N,N-bis-(2-hydroxyethyl)-2,5-diazobicyclo[2.2.1]heptane; N-triisopropanolamine; dibutyl amine preferably branched isomers thereof such as diisobutylamine and ditertbutylamine; tributyl amine and again branched isomers thereof such as ditertbuylamine and tritertbutylamine; and the like. Optionally substituted piperidine and other optionally piperazine compounds also will be suitable, particularly hydroxy-substituted or $C_{1-12}$alcohol-substituted piperidines and piperazines, such as N-ethanol piperidine and N-diethanol piperazine. Other basic compounds also are suitable, particularly having one or more nitrogen ring members and 5 to about 8 total ring members.

Other preferred base additives include hydroxy-alkyl secondary and teriarty amines, e.g. secondary and tertiary amines having at least one N-substituent of $C_{2-20}$alkyl having one, two three or more hydroxy moieties, typically one or two hydroxy moieties; alicyclic amines where at least one secondary or tertiary nitrogen is at the junction or bridgehead of a bicyclic or multicyclic compound. Pyridyl compounds also will be suitable such as di-butyl pyridine and polymers thereof such as poly(vinylpyridine). In general, polymeric basic additives will be suitable, e.g. substituted amines having a molecular weight of up to about 200, 300, 400, 500, 600, 700, 800, 900, 1000, 1100, 1200, 1300, 1400 or 1500.

In a particular resist system, the basic additive should be substantially non-interfering with the photoactive component, i.e. not reactive with a PAG during typical storage of a resist. In particular, a base additive is preferably selected to avoid undesired degradation of the photoacid generator during storage of a resist composition, e.g. 2, 3, 4, 5 or 6 months at room temperature (ca. 25° C.) or reduced temperature such as refrigerated conditions (e.g., ca. 5, 10, 15 or 18° C.). More specifically, for resists that contain a dicarboxylate imide PAG (such as depicted in Formulae II and IIA above), or an iodonim compound such as those PAGs of Formula I above, preferably secondary or tertiary amines are employed, particularly hindered secondary or tertiary amines, such as moncyclic, bicylic and tricylic amines where nitrogen is a ring member e.g. DBU, DBN, alkylated pyridines e.g. pyridine substituted with one or more $C_{1-18}$alkyl groups, optionally substitute quinolines, optionally substituted piperidines, optionally substituted pyrazines, and the like. In addition to alicyclic base additives with nitrogen ring members, also preferred for use in combination with imidosulfonate and iodonium PAGs are non-cyclic secondary and tertiary amines having one or more alkyl substituents with at least about 4 carbon atoms. Hindered secondary and tertiary amines substituted with one or more alkyl groups, such as $C_{1-20}$alkyl groups, also are preferred for use with an iodonium PAG.

Carboxylate additives (e.g. a carboxylate salt such as a ammonium carboxylate salt) are much less preferred for use with a dicarboxylate imide. Carboxylate additives are also less preferred with an iodonium PAG.

The basic additive is suitably employed in a resist composition is an amount of 0.01 to 5 weight percent based on total solids of the resist (all components except solvent), more preferably about 0.05 to 2 weight percent of total solids.

Dissolution Inhibitor Compounds

Preferred dissolution inhibitor compounds of resists of the invention are polymeric and/or comprise fluorine substitution. As discussed above, preferred dissolution inhibitor compounds include those that contain a photoacid-labile group, e.g. a photoacid-labile ester or acetal moiety. Lower molecular weight materials also are generally preferred, e.g. polymers or oligomers having an Mw of less than 5,000, more preferably less than about 4,000, 3,000, 2,000, 1,000 or 500. Fluorinated polymers or oligomers are particularly preferred dissolution inhibitor compounds.

The dissolution inhibitor also need not be polymeric (i.e. contain repeat units). For example, a variety of non-polymeric compositions are suitable dissolution inhibitors for resists of the invention, particularly where those materials are fluorinated. For instance, suitable are fluorinated compounds having one or more separate or fused rings, including fluorinated steroidal compounds, e.g. a fluorinated cholates and lithocholates such as cholic acid, deoxycholic acid, lithocholic acid, t-butyl deoxycholate, t-butyl lithocholate, and the like. Fluoirnated steroidal compounds may be suitably preferred by fluorination of a known steroid, where a carbonyl group is modified to a difluromethylene. Such non-polymeric compounds also may have one photoacid-labile groups, e.g. a photoacid-labile ester or acetal moiety.

One or more dissolution inhibitor compounds may be suitably present in a resist composition in an amount of from about 0.001 to 5 or more weight percent based on total solids (all components except solvent), more preferably 0.001 to 1 weight percent of total solids of a resist.

Surfactants and Levelers

Surfactant and leveling agents employed in resists of the invention include e.g. silicon-containing compounds and ionic salts such as an ammonium compound. Silicon-containing compounds are generally preferred surfactant agents. Exemplary preferred surfactants and levelers include Silwet 7604 (siloxane copolymer available from Union Carbide); FC-430 (an imidosulfoante, available from 3M); RO8 (mixture containing a fluoroalcohol); Modaflow (an acrylate material). Surfactants and levelers may be suitably employed in amounts as disclosed above for dissolution inhibitor compounds.

Plasticizer Compounds

As discussed above, resists of the invention also may contain one or more plasticizer materials, which can inhibit or prevent undesired crazing or cracking of a deposited resist layer as well as enhance adhesion of the resist layer to an underlying material. Preferred plasticizers include e.g. materials having one or more hetero atoms (particularly S or O), and preferably materials having a molecular weight of about 20 to 1000, more typically about 20 to about 50, 60, 70, 80, 90, 100, 150, 200, 250, 300, 400 or 500, e.g. adipates, sebacates and phthalates such as bis(2-butoxyethyl)adipate; bis(2-butoxyethyl)sebacate; bis-(2-butoxyethyl)phthalate; 2-butoxyethyl oleate; diisodecyl adipate; diisodecyl glutarate; and poly(ethylene glycols) such as poly(ethyleneglycol)acrylate, poly(ethylene glycol)bis(2-ethylhexanoate), poly(ethylene glycol)dibenzoate, poly(ethylene glycol)dioleate, poly(ethylene glycol)monooleate, tri(ethylene glycol)bis(2-ethylhexanoate), and the like.

One or more plasticizer compounds may be suitably present in a resist composition in an amount of from about 0.5 to 10 or more weight percent based on total solids (all components except solvent), more preferably 0.5 to 3 weight percent of total solids of a resist.

As discussed, various moieties of PAGs, base additives and resin units, and other components of resists of the invention may be optionally substituted, typically 1, 2, or 3 positions by one or more suitable groups such as e.g. halogen (particularly F, Cl or Br); $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl; carobcyclic aryl such as phenyl; and the like, although multiple carbon-carbon bonds and aromatic groups will be less preferred due to excessive absorbance of exposure radiation.

Preferred substitution groups will generally include or consist of at least one halogen atom, preferably fluorine such as fluorinated $C_{1-12}$alkyl, perfluoro$C_{1-12}$alkyl, and perfluoro$C_{1-12}$alkylene, fluorinated $C_{3-8}$cycloalkyl, and fluorinated ethers (including $C_{1-12}$ alkoxy) and esters (including $C_{1-12}$ esters) including fluorinated cyclic ethers and fluorinated cyclic esters.

As used herein, the term alkyl, alkenyl and alkynyl unless otherwise modified refers to both cyclic groups, although of course cyclic groups will comprise at least three carbon ring members. Alkoxy groups of resist components suitably have 1 to about 16 carbons and 1, 2, 3 or 4 alkoxy linkages. Suitable alkanoyl groups have 1 to about 16 carbons and one or more carbonyl groups, typically 1, 2 or 3 carbonyl groups. Carbocyclic aryl as used herein refers to non-hetero aromatic groups that have 1 to 3 separate or fused rings and 6 to about 18 carbon ring members and may include phenyl, naphthyl, biphenyl, acenaphthyl, phenanthracyl and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrimdinyl, furyl, pyrrolyl, thienyl, thiazolyl, oxazolyl, imidazolyl, indolyl, benzofuranyl and benzothiazole.

The resists of the invention can be readily prepared by those skilled in the art. For example, a photoresist composition of the invention can be prepared by dissolving the components of the photoresist in a suitable solvent as disclosed herein, e.g. a blend of 2-hetpanone and ethyl lactate, which is a preferred solvent. Typically, the solids content of the composition varies between about 5 and 35 percent by weight of the total weight of the photoresist composition, more typically 5 to about 12 or 15 weight of the total weight of the photoresist composition. The resin binder and photoactive components should be present in amounts sufficient to provide a film coating layer and formation of good quality latent and relief images. See the example which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm ad sub-170 nm exposure wavelength, particularly 157 nm is a particularly preferred exposure wavelength. However, the resist compositions of the invention also may be suitably imaged at higher wavelengths. For example, a resin of the invention can be formulated with an appropriate PAG and a sensitizer if needed and imaged at higher wavelengths such as about 193 nm or 248 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. Plasma development also may be employed. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CH_3$ etchant applied as a plasma stream. After such processing, resist may be removed from the processed substrate using known stripping procedures.

All documents mentioned herein are incorporated herein by reference. The following non-limiting example is illustrative of the invention.

EXAMPLE 1

Preparation of a Resist of the Invention.

A resist of the invention is prepared by admixing the following components where amounts are expressed as weight percent of solids (all components except solvent) and the resist is formulated as a 90 percent fluid formulation:

| Component | Amount |
| --- | --- |
| Resist | balance solids |
| PAG | 5 |
| Basic Additive | 0.5 |
| Dissolution inhibitor | 10 |
| Surfactant | 0.2 |
| Plasticizer | 0.6 |
| Solvent | to 10 weight percent solids |

In the resist, the resin is a fluorine-containing terpolymer consisting of norbornene; t-butylacrylate and tetrefluorethylene (TEE) units prepared by free radical polymerization of the monomers; the PAG is a compound of the Formula IIa above where X is methylene and R is —$CF_3$; the basic additive is DBU; the dissolution inhibitor is fluorinated cholic acid; the surfactant is Silwet 7604; the plasticizer is poly(ethylene glycol)dioleate; and the solvent is a 70:30 v/v blend of 2-heptanone and ethyl lactate.

The formulated resist composition is spin coated onto HMDS vapor primed 4 inch silicon wafers and softbaked via a vacuum hotplate at 90° C. for 60 seconds. The resist coating layer is exposed through a photomask at 157 nm, and then the exposed coating layers are post-exposure baked at 110° C. The coated wafers are then treated with 0.26N aqueous tetramethylammonium hydroxide solution to develop the imaged resist layer and provide a relief image.

The foregoing description of the invention is merely illustrative thereof, and it is understood that variations and modifications can be effected without departing from the spirit or scope of the invention as set forth in the following claims.

What is claimed is:

1. A photoresist composition comprising a fluorinated resin, a photoactive component, and a solvent component, the solvent component comprising a mixture of least two distinct solvents, wherein one of the distinct solvents does not contain a ketone moiety, and with the exclusion of a solvent component consisting of methyl ethyl ketone and chlorobenzene.

and wherein the solvent component comprises at least two solvents that can form a room temperature azeotrope.

2. A photoresist composition of claim 1 wherein the solvent component comprises a heptanone.

3. A photoresist composition of claim 1 wherein the solvent component comprises cyclohexanone.

4. A photoresist composition of claim 1 wherein the solvent component comprises ethyl lactate.

5. A photoresist composition of claim 1 wherein the solvent component comprises propylene glycol methyl ether acetate.

6. A photoresist composition of claim 1 wherein the solvent component comprises two or more distinct solvents selected from the group consisting of heptanone; ethyl-n-amyl-ketone; methyl ethyl ketone; ethylene glycol ethyl ether; propylene glycol methyl ether acetate; amyl acetate; methyl iso-amyl ketone; ethylene glycol methyl ether acetate; methylamyl acetate; ethylene glycol methyl ether acetate; ethyl-n-butyl ketone; iso-butyl isobutyrate; 2-methyl-1-pentanol (hexanol); ethylene glycol propyl ether; propylene glycol t-butyl ether; methylcaproate; ethyl caproate (ethyl hexanoate); cumene (isopropylbenzene); xylenes; anisole; ethylene glycol ethyl ether acetate; 1-tridecanol; cyclohexanol; mesitylene; hexyl acetate; diethylene glycol dimethyl ether (diglyme); diisobutyl ketone; di-n-propyl carbonate; diacetonealcohol; ethylene glycol butyl ether; and propylene glycol butyl ether.

7. A photoresist composition of claim 1 wherein the photoresist comprises at least three distinct solvents.

8. An article of manufacture comprising a substrate having a coating layer thereon of a photoresist composition of claim 1.

9. The article of claim 8 wherein the substrate is a microelectronic wafer substrate.

10. The article of claim 8 wherein the substrate is an optical-electronic device substrate.

11. A photoresist composition comprising a fluorinated resin, a photoactive component, and a solvent component, the solvent component comprising a mixture of at least three distinct solvents, and wherein the solvent component comprises at least two solvents that can form a room temperature azeotrope.

12. A photoresist composition of claim 11 wherein the solvent component comprises a heptanone.

13. A photoresist composition of claim 11 wherein the solvent component comprises cyclohexanone.

14. A photoresist composition of claim 11 wherein the solvent component comprises ethyl lactate.

15. A photoresist composition of claim 11 wherein the solvent component comprises propylene glycol methyl ether acetate.

16. A photoresist composition of claim 11 wherein the solvent component comprises three or more distinct solvent selected from the group consisting of heptanone; ethyl-n-amyl-ketone; ethylene glycol ethyl ether; propylene glycol methyl ether acetate; amyl acetate; methyl iso-amyl ketone; methyl ethyl ketone; ethylene glycol methyl ether acetate; methylamyl acetate; ethylene glycol methyl ether acetate; ethyl-n-butyl ketone; iso-butyl isobutyrate; 2-methyl-1-pentanol (hexanol); ethylene glycol propyl ether; propylene glycol t-butyl ether; methylcaproate; ethyl caproate (ethyl hexanoate); cumene (isopropylbenzene); xylenes; anisole; ethylene glycol ethyl-ether acetate; 1-tridecanol; cyclohexanol; mesitylene; hexyl acetate; diethylene glycol dimethyl ether (diglyme); diisobutyl ketone; di-n-propyl carbonate; diacetonealcohol; ethylene glycol butyl ether; and propylene glycol butyl ether.

17. A photoresist composition comprising a fluorinated resin, a photoactive component, and a solvent component, the solvent component comprising at least two solvents that can form a room temperature azeotrope.

18. A photoresist composition of claim 17 wherein the solvent component comprises at least three distinct solvents.

19. A photoresist composition of claim 17 wherein the solvent component comprises at least four solvents.

20. A method for forming a photoresist relief image; comprising:

applying a coating layer of a photoresist composition of claim 1 or 17 to a substrate;

exposing the photoresist coating layer to activating radiation and developing the exposed resist layer.

21. The method of claim 20 wherein the photoresist coating layer is exposed to radiation having a wavelength of less than about 200 nm.

22. The method of claim 20 wherein the photoresist coating layer is exposed to radiation having a wavelength of less than about 170 nm.

23. The method of claim 20 wherein the photoresist coating layer is exposed to radiation having a wavelength of about 157 nm.

* * * * *